United States Patent
Xie et al.

(10) Patent No.: US 11,107,827 B2
(45) Date of Patent: Aug. 31, 2021

(54) INTEGRATION OF SPLIT GATE METAL-OXIDE-NITRIDE-OXIDE-SEMICONDUCTOR MEMORY WITH VERTICAL FET

(71) Applicant: INTERNATIONAL BUSINESS MACHINES CORPORATION, Armonk, NY (US)

(72) Inventors: Ruilong Xie, Niskayuna, NY (US); Julien Frougier, Albany, NY (US); Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 47 days.

(21) Appl. No.: 16/288,906

(22) Filed: Feb. 28, 2019

(65) Prior Publication Data
US 2020/0279858 A1    Sep. 3, 2020

(51) Int. Cl.
| | | |
|---|---|---|
| *H01L 29/423* | (2006.01) | |
| *H01L 27/11573* | (2017.01) | |
| *H01L 27/11582* | (2017.01) | |
| *H01L 27/11565* | (2017.01) | |

(52) U.S. Cl.
CPC .. *H01L 27/11573* (2013.01); *H01L 27/11582* (2013.01); *H01L 29/4234* (2013.01); *H01L 27/11565* (2013.01)

(58) Field of Classification Search
CPC ......... H01L 27/11573; H01L 27/11273; H01L 27/2454; H01L 27/11531; H01L 27/115–11597; H01L 29/40114; H01L 29/42328; H01L 29/7926; H01L 29/4234; H01L 29/78642; H01L 29/7887; H01L 29/7889; H01L 29/78; H01L 29/66477
See application file for complete search history.

(56) References Cited

U.S. PATENT DOCUMENTS

| | | | |
|---|---|---|---|
| 4,574,209 | A | 3/1986 | Lade et al. |
| 6,150,687 | A | 11/2000 | Noble et al. |
| 6,583,466 | B2 | 6/2003 | Lin et al. |
| 7,052,941 | B2 | 5/2006 | Lee |
| 7,564,084 | B2 | 7/2009 | Song et al. |

(Continued)

OTHER PUBLICATIONS

Yasuhiko Taito et al., "A 28 nm Embedded Split-Gate MONOS (SG-MONOS) Flash Macro for Automotive Achieving 6.4 GB/s Read Throughput by 200 MHz No-Wait Read Operation and 2.0 Mb/s Write Throughput at Tj of 170° C.," IEEE Journal of Solid-State Circuits, vol. 51, No. 1, 2016, pp. 213-221.

*Primary Examiner* — Matthew C Landau
*Assistant Examiner* — Eric K Ashbahian
(74) *Attorney, Agent, or Firm* — Cantor Colburn LLP; Joseph Petrokaitis

(57) ABSTRACT

Embodiments of the present invention are directed to techniques for integrating a split gate metal-oxide-nitride-oxide-semiconductor (SG-MONOS) memory with a vertical field effect transistor (VFET). In a non-limiting embodiment of the invention, a vertical SG-MONOS memory device is formed on a first region of a substrate. The SG-MONOS memory device can include a charge storage stack, a memory gate on the charge storage stack, and a control gate vertically stacked over the charge storage stack and the memory gate. A VFET is formed on a second region of the substrate. The VFET can include a logic gate.

14 Claims, 17 Drawing Sheets

(56) References Cited

U.S. PATENT DOCUMENTS

| | | |
|---|---|---|
| 7,781,283 B2 | 8/2010 | Anderson et al. |
| 7,868,375 B2 | 1/2011 | Liu et al. |
| 8,669,161 B2 | 3/2014 | Higashi |
| 9,343,537 B2 | 5/2016 | Tang |
| 9,379,128 B1 | 6/2016 | Yi et al. |
| 9,673,102 B2 | 6/2017 | Liu et al. |
| 9,691,907 B1 * | 6/2017 | Huang ................ H01L 29/7889 |
| 2005/0001258 A1 | 1/2005 | Forbes |
| 2009/0050955 A1 | 2/2009 | Akita et al. |
| 2014/0159114 A1 * | 6/2014 | Zheng ............... H01L 29/66477 257/192 |
| 2015/0155360 A1 * | 6/2015 | Kim .................. H01L 29/66833 257/314 |
| 2017/0162590 A1 * | 6/2017 | Chuang ............. H01L 29/66545 |
| 2018/0151561 A1 * | 5/2018 | Cantoro ................ H01L 27/088 |
| 2020/0035829 A1 * | 1/2020 | Do ........................ H01L 27/092 |

* cited by examiner

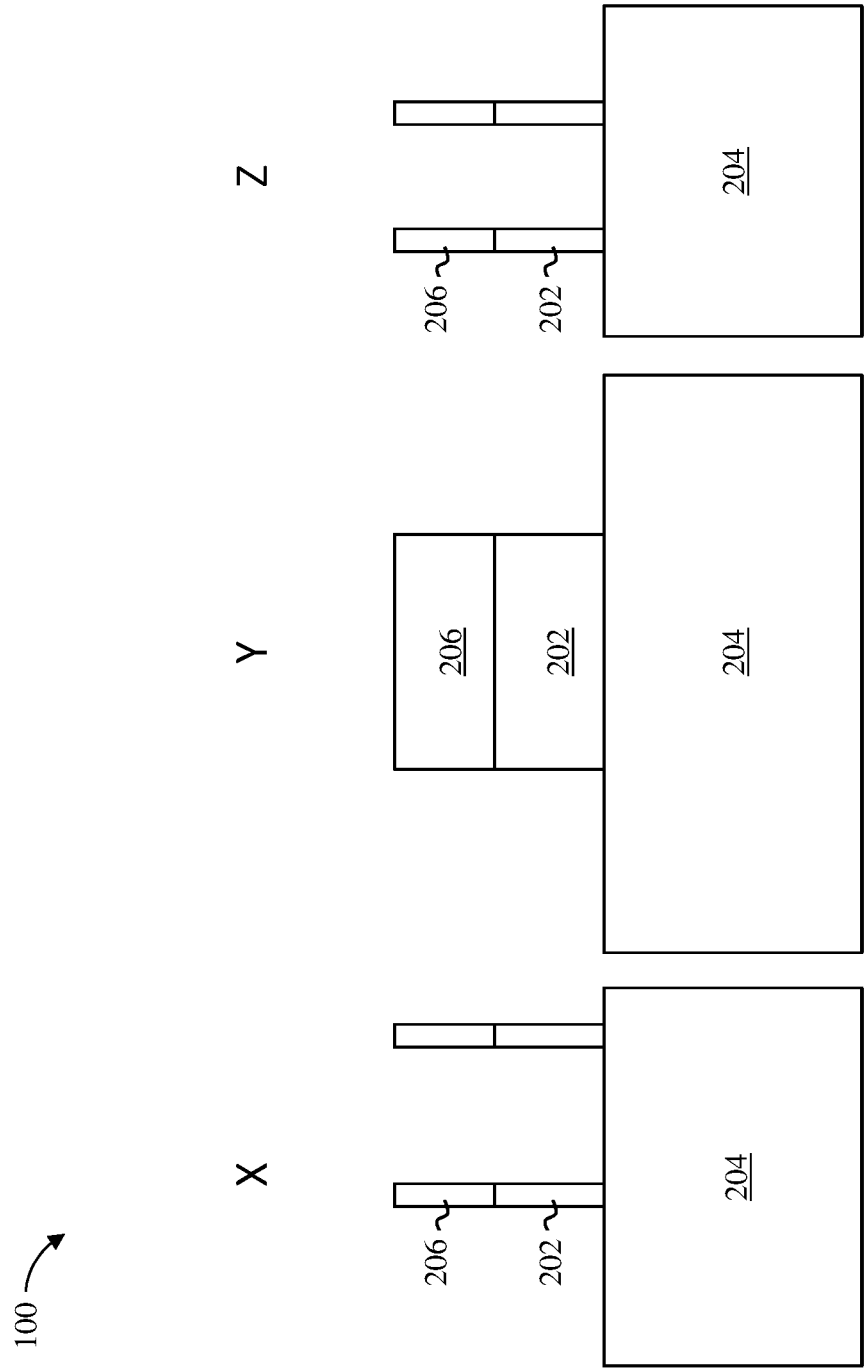

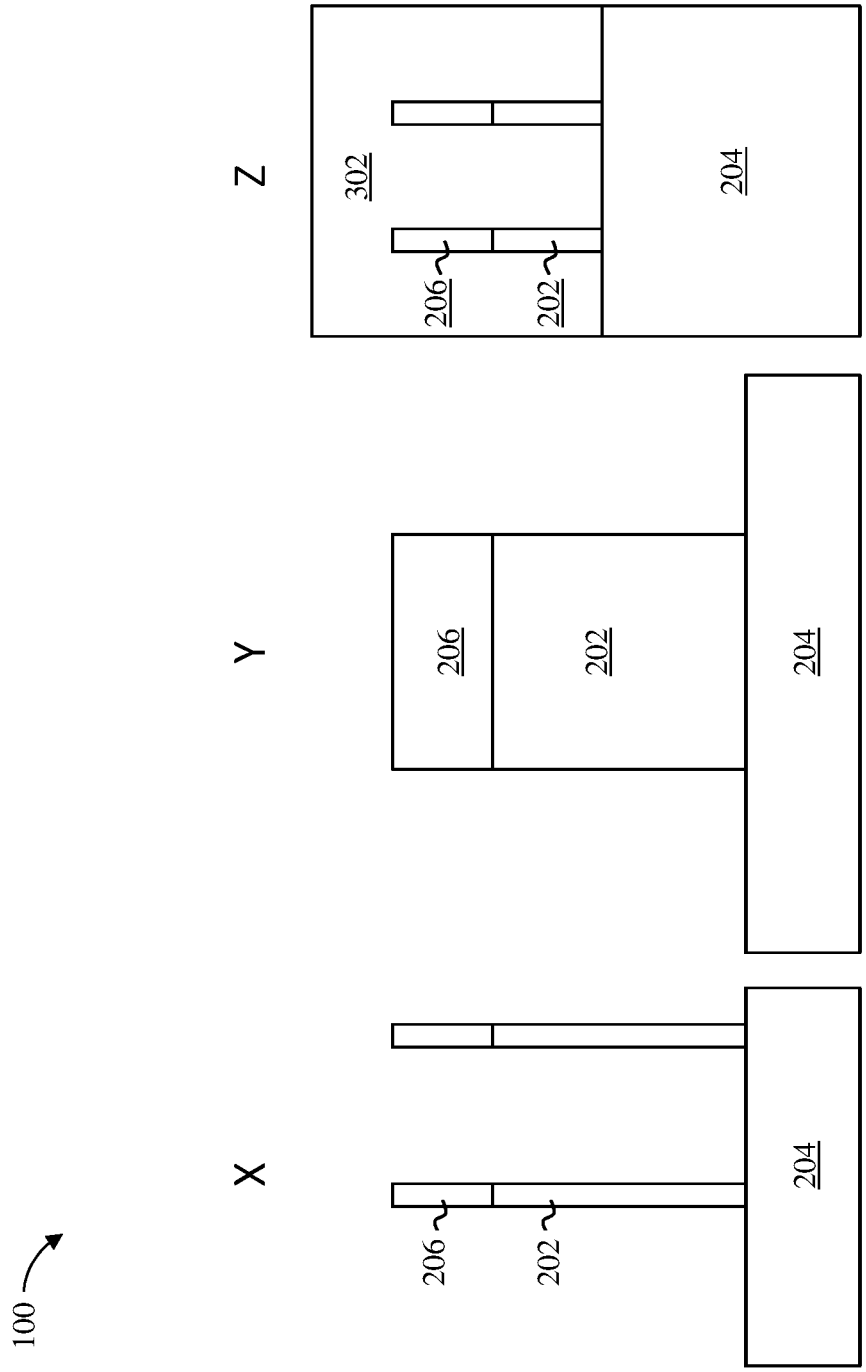

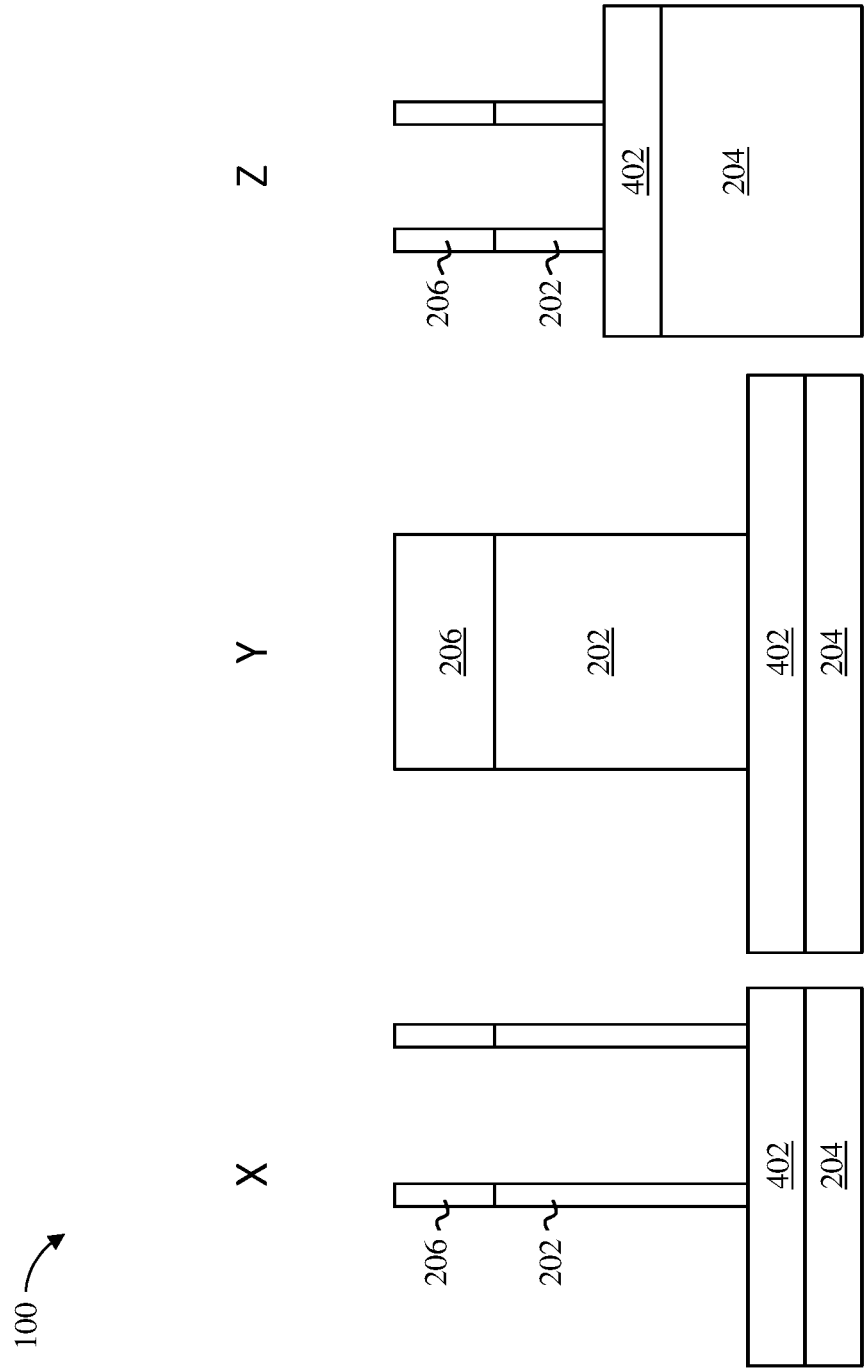

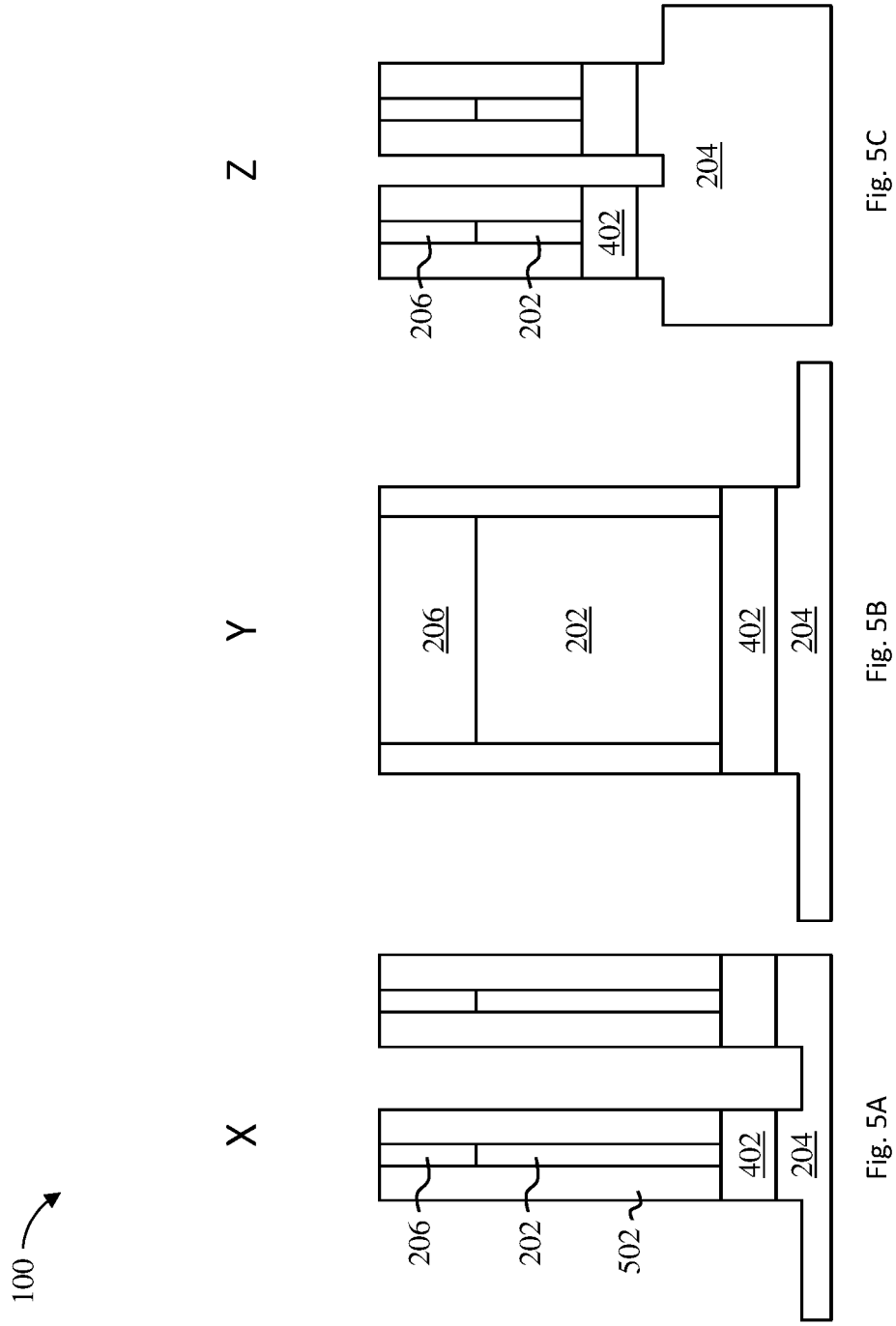

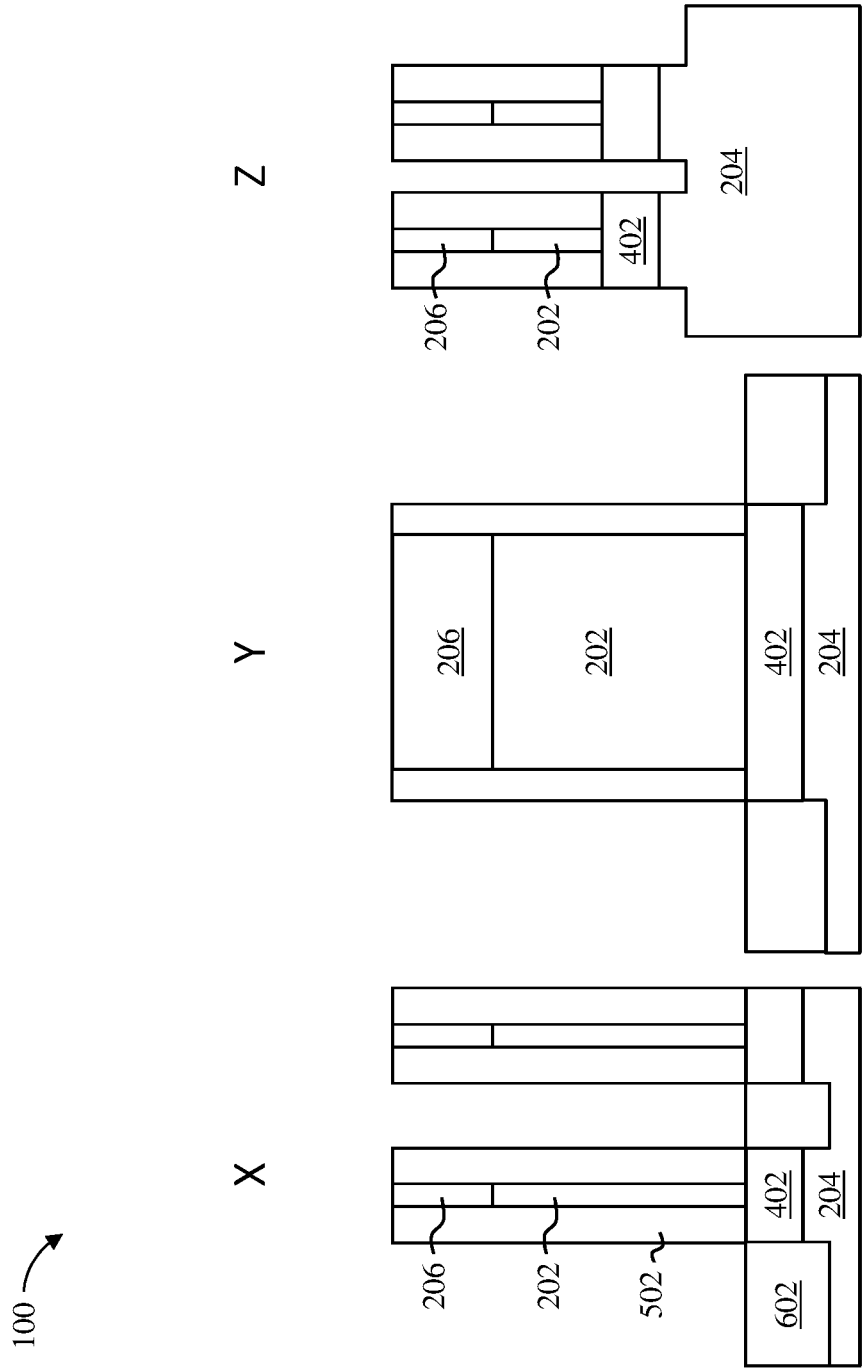

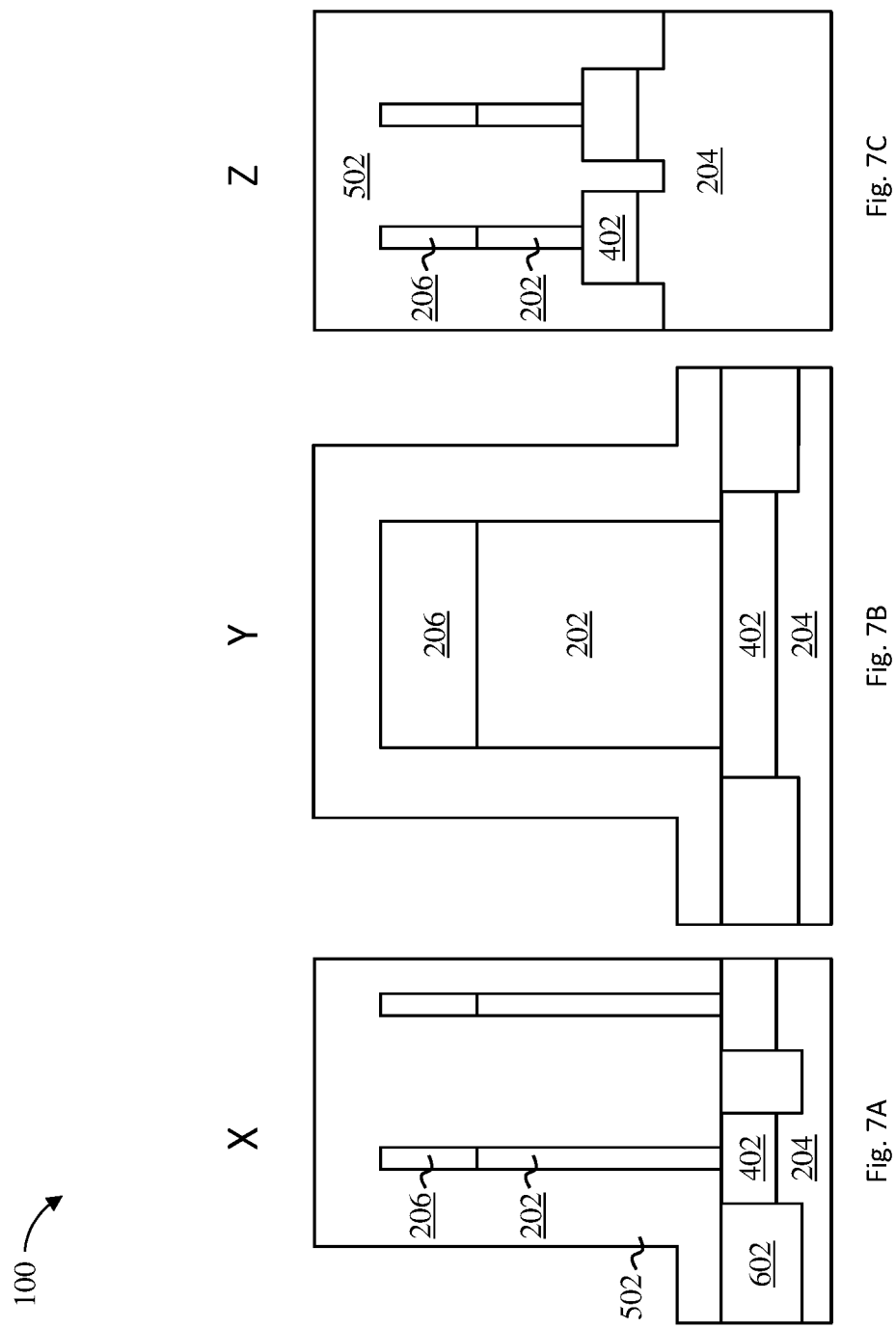

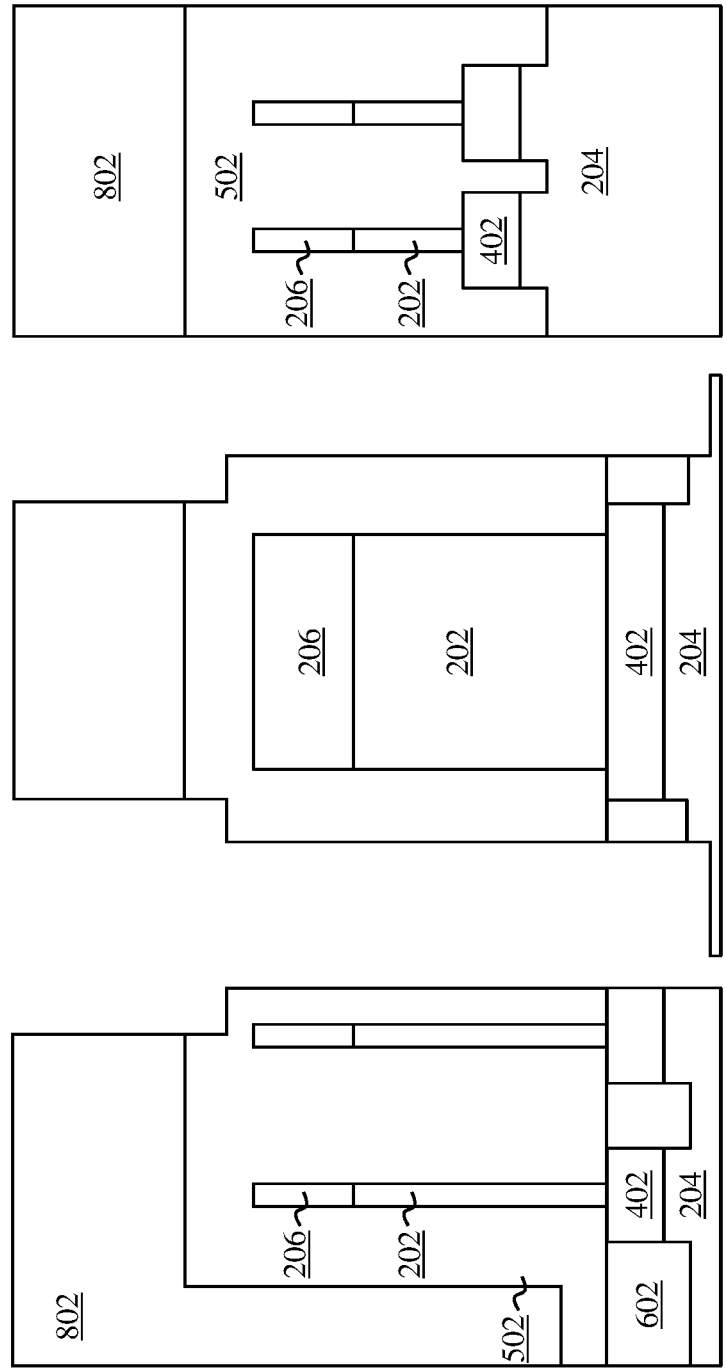

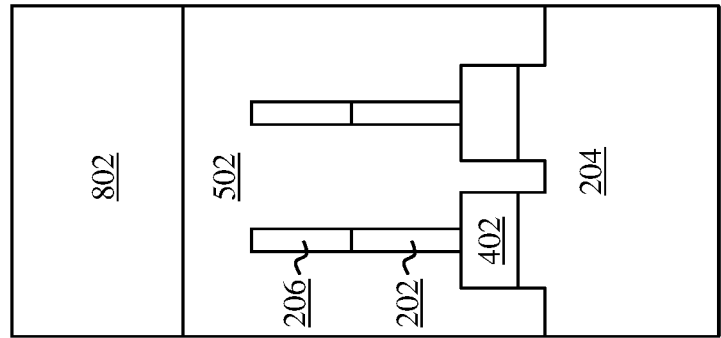
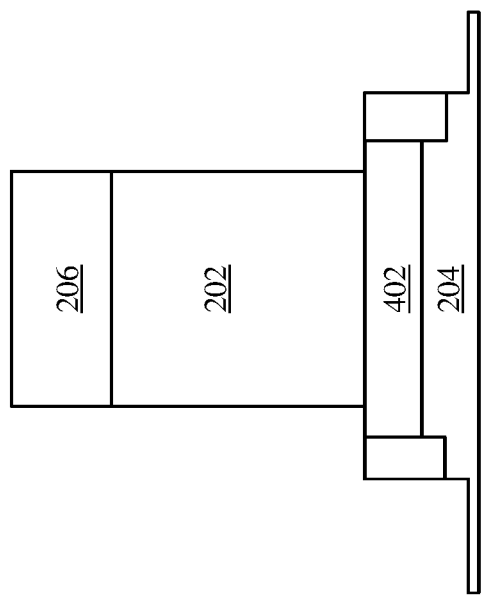
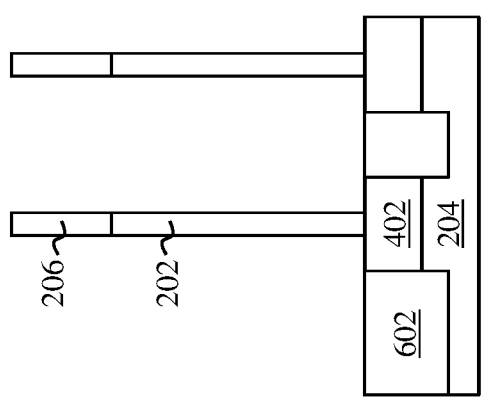

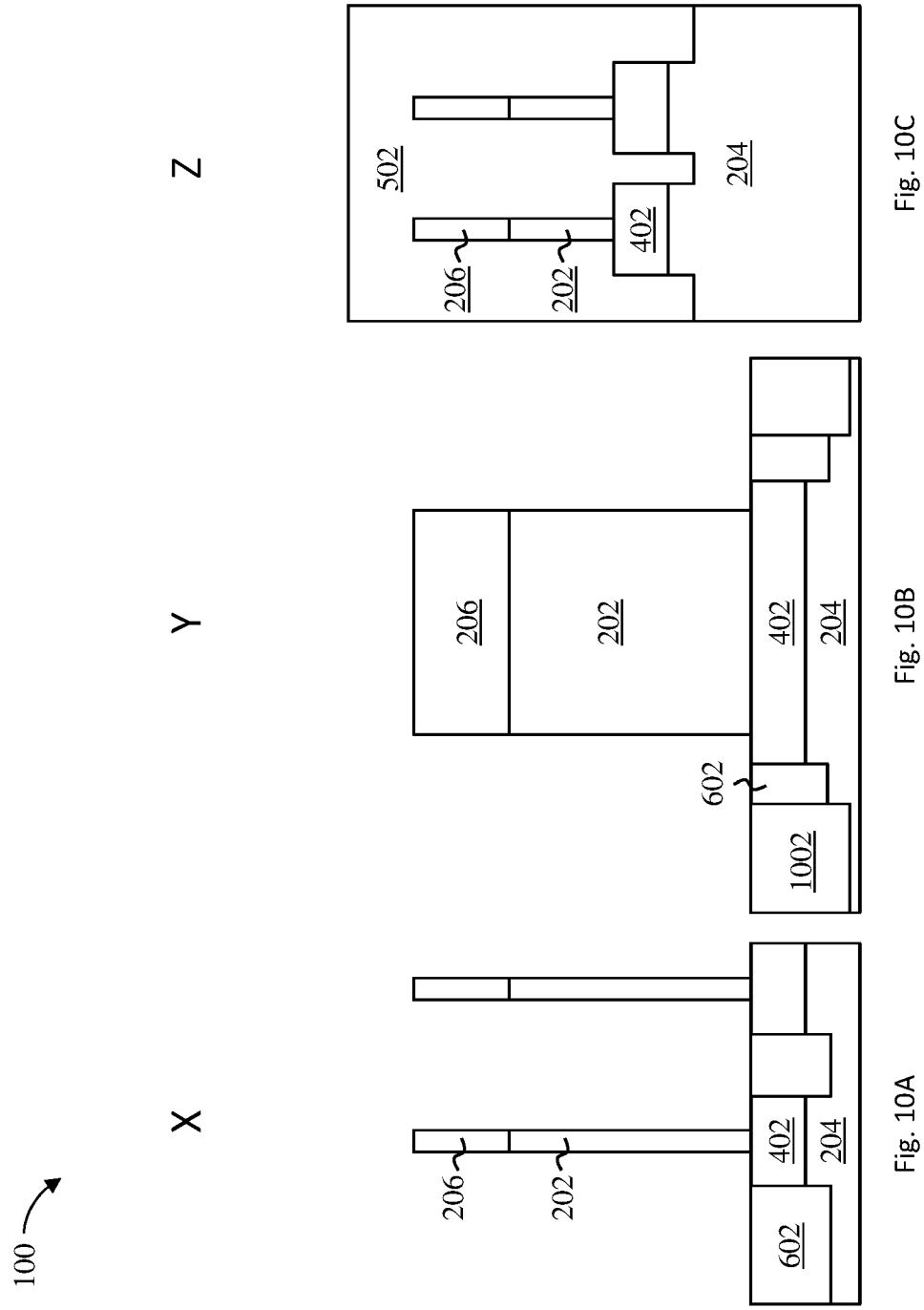

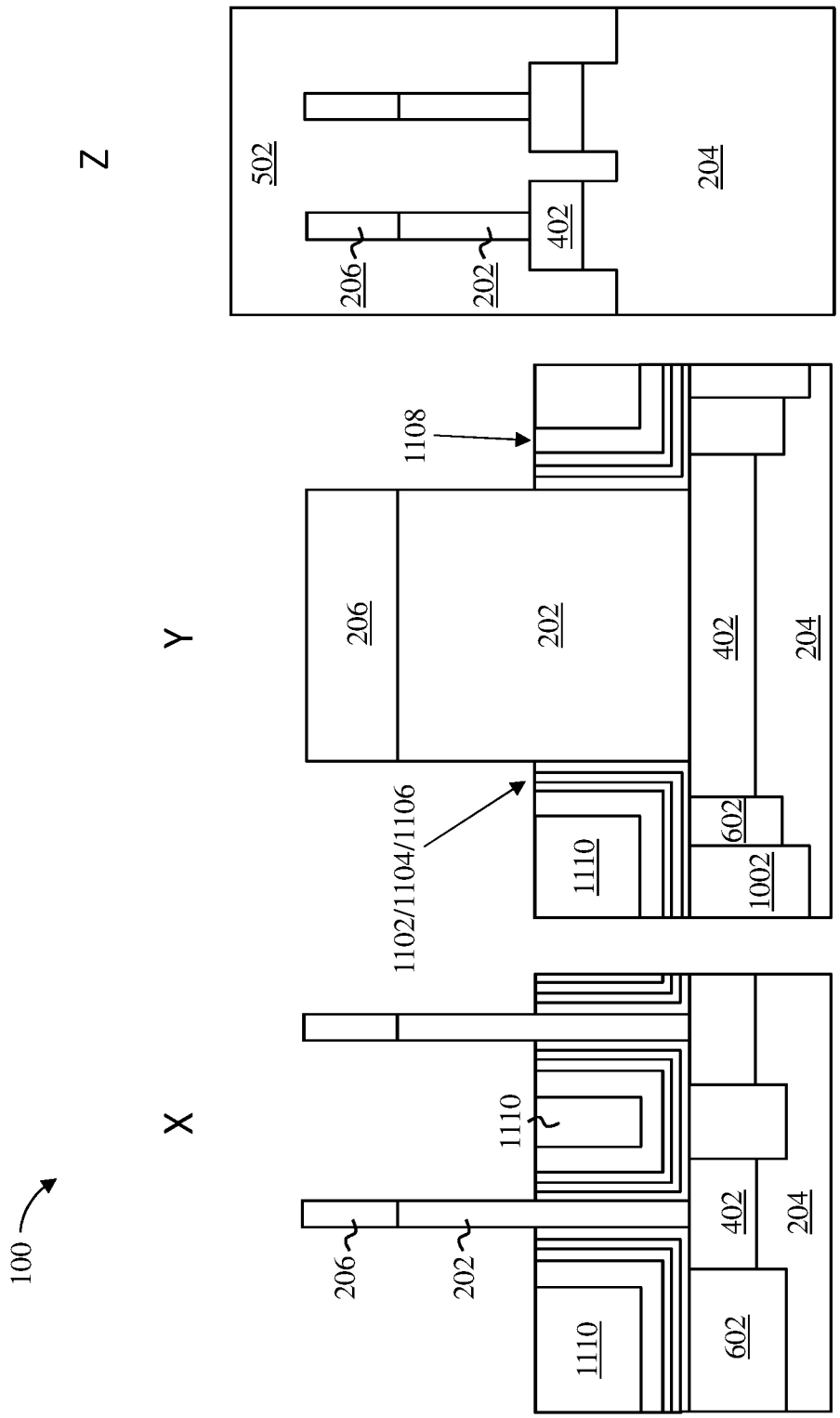

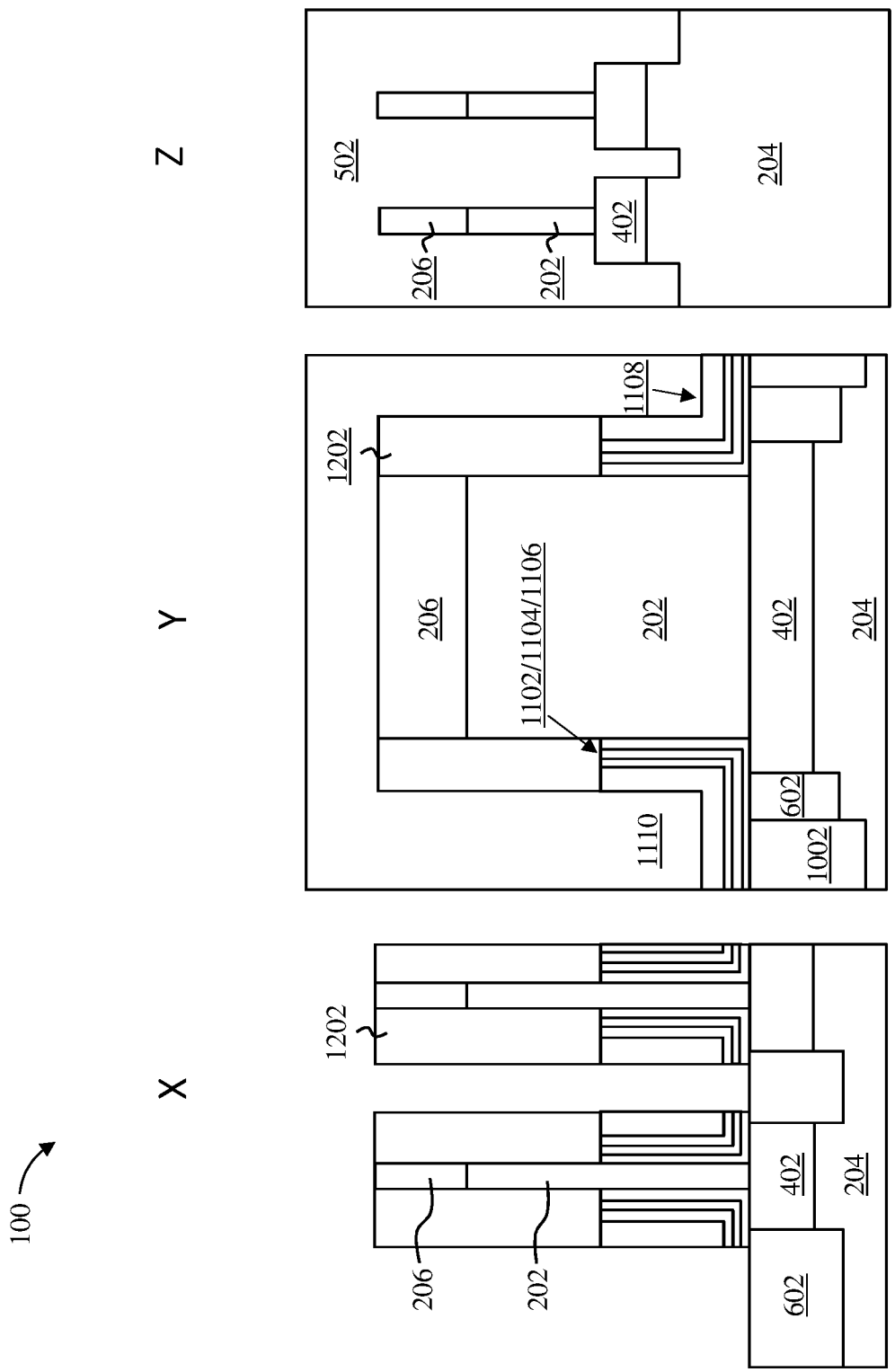

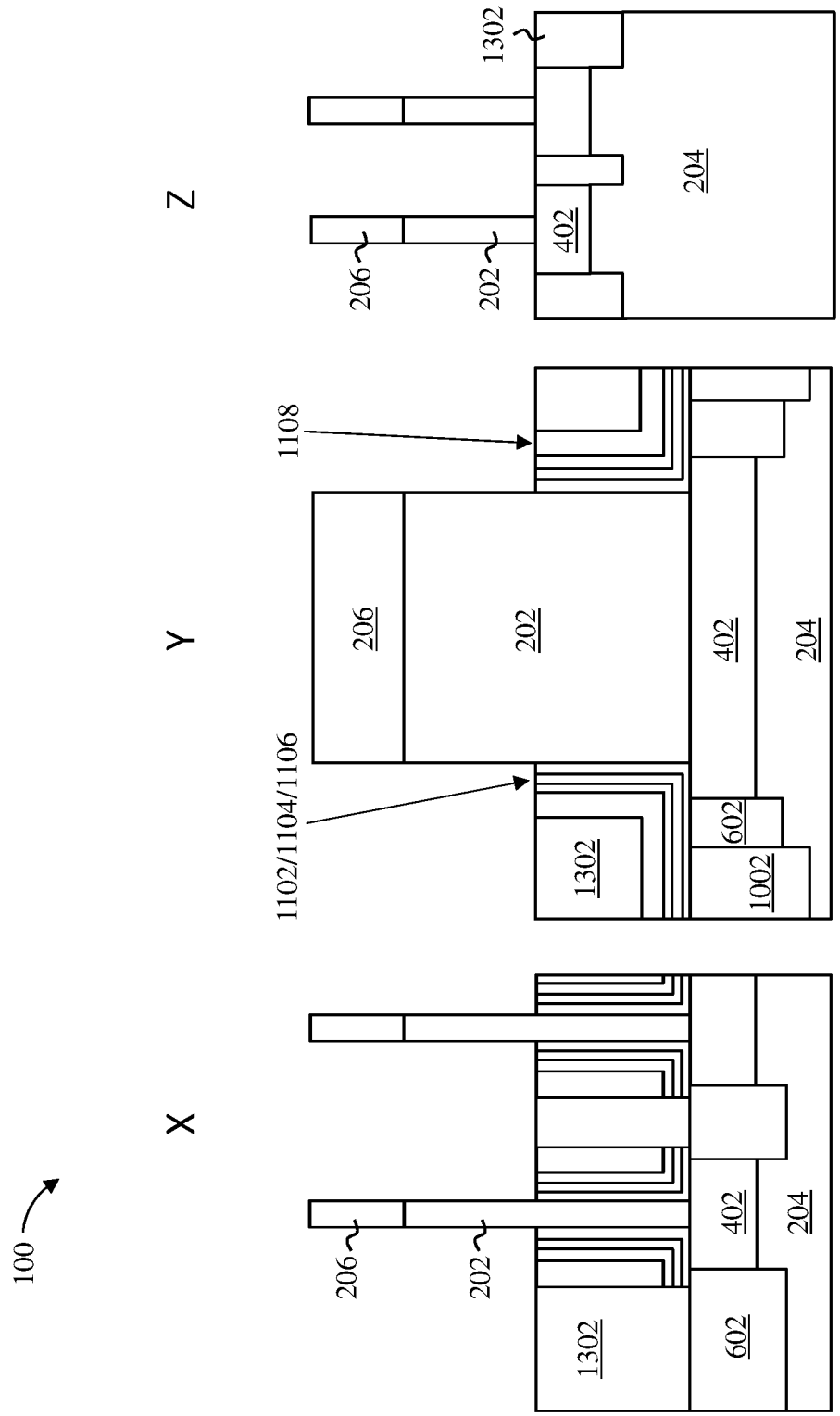

INTEGRATION OF SPLIT GATE METAL-OXIDE-NITRIDE-OXIDE-SEMICONDUCTOR MEMORY WITH VERTICAL FET

BACKGROUND

The present invention generally relates to fabrication methods and resulting structures for semiconductor devices, and more specifically, to fabrication methods and resulting structures for integrating a split gate metal-oxide-nitride-oxide-semiconductor (SG-MONOS) memory with a vertical field effect transistor (VFET).

In nonvolatile memory cells in practical use today, field effect transistors (FETs) are used for memory storage, in which a threshold voltage varies with accumulation of an electric charge. The increasing demand for microcontroller units (MCUs) that offer high reliability and high performance has driven the development of embedded nonvolatile memory. Embedded memory is any non-stand-alone memory that is integrated directly on-chip to support the logic core. Embedding a nonvolatile memory cell and a logic semiconductor device together on the same silicon substrate can enable improved, high-performance electronic devices, in part because the embedded memory reduces inter-chip communication. Embedded memory offers other advantages as well, such as a reduced number of chips, a reduced pin count, multi-port memories, less board space requirements, faster response (latency), dedicated architectures, memory capacity specific for an application, reduced power consumption, and a greater cost effectiveness at the system level.

High-performance embedded memory is a key component in many demanding applications because of its high-speed and wide bus-width capability. For instance, MCUs with embedded flash memory have been mounted in cars to enhance automotive electronic control systems. Embedded flash memories (eFlash) are used for control program code storage and temporary data storage to provide more flexibility for program updates and more elaborate control. Floating gate memory and SG-MONOS memory are two possible embedded nonvolatile memory cell architectures for implementing eFlash.

SUMMARY

Embodiments of the invention are directed to a method for forming a semiconductor device. A non-limiting example of the method includes forming a vertical SG-MONOS memory device on a first region of a substrate. The SG-MONOS memory device can include a charge storage stack, a memory gate on the charge storage stack, and a control gate vertically stacked over the charge storage stack and the memory gate. The method can include forming a VFET on a second region of the substrate. The VFET can include a logic gate.

Embodiments of the invention are directed to a method for forming a semiconductor device. A non-limiting example of the method includes forming a semiconductor fin on a substrate. A charge storage stack is formed on a sidewall of the semiconductor fin. The charge storage stack can include a tunneling oxide layer, an insulating oxide layer, and a charge storage layer between the tunneling oxide layer and the insulating oxide layer. The method can include forming a memory gate on the charge storage stack. The method can include forming a control gate vertically stacked over the charge storage stack and the memory gate and on the sidewall of the semiconductor fin.

Embodiments of the invention are directed to a semiconductor device. A non-limiting example of the semiconductor device includes a vertical SG-MONOS memory device. The SG-MONOS device can include a charge storage stack, a memory gate on the charge storage stack, and a control gate vertically stacked over the charge storage stack and the memory gate. The semiconductor device can include a vertical field effect transistor (VFET) having a logic gate.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 2A depicts a cross-sectional view of the semiconductor structure of FIG. 1 along the line X after initial processing operations according to one or more embodiments of the invention;

FIG. 2B depicts a cross-sectional view of the semiconductor structure of FIG. 1 along the line Y after initial processing operations according to one or more embodiments of the invention;

FIG. 2C depicts a cross-sectional view of the semiconductor structure of FIG. 1 along the line Z after initial processing operations according to one or more embodiments of the invention;

FIG. 3A depicts a cross-sectional view of the semiconductor structure of FIG. 1 along the line X during an intermediate operation of a method of fabricating a semiconductor device according to one or more embodiments of the invention;

FIG. 3B depicts a cross-sectional view of the semiconductor structure of FIG. 1 along the line Y during an intermediate operation of a method of fabricating a semiconductor device according to one or more embodiments of the invention;

FIG. 3C depicts a cross-sectional view of the semiconductor structure of FIG. 1 along the line Z during an intermediate operation of a method of fabricating a semiconductor device according to one or more embodiments of the invention;

FIG. 4A depicts a cross-sectional view of the semiconductor structure of FIG. 1 along the line X during an intermediate operation of a method of fabricating a semiconductor device according to one or more embodiments of the invention;

FIG. 4B depicts a cross-sectional view of the semiconductor structure of FIG. 1 along the line Y during an intermediate operation of a method of fabricating a semiconductor device according to one or more embodiments of the invention;

FIG. 4C depicts a cross-sectional view of the semiconductor structure of FIG. 1 along the line Z during an intermediate operation of a method of fabricating a semiconductor device according to one or more embodiments of the invention;

FIG. 5A depicts a cross-sectional view of the semiconductor structure of FIG. 1 along the line X during an intermediate operation of a method of fabricating a semiconductor device according to one or more embodiments of the invention;

FIG. 5B depicts a cross-sectional view of the semiconductor structure of FIG. 1 along the line Y during an intermediate operation of a method of fabricating a semiconductor device according to one or more embodiments of the invention;

FIG. 5C depicts a cross-sectional view of the semiconductor structure of FIG. 1 along the line Z during an intermediate operation of a method of fabricating a semiconductor device according to one or more embodiments of the invention;

FIG. 6A depicts a cross-sectional view of the semiconductor structure of FIG. 1 along the line X during an intermediate operation of a method of fabricating a semiconductor device according to one or more embodiments of the invention;

FIG. 6B depicts a cross-sectional view of the semiconductor structure of FIG. 1 along the line Y during an intermediate operation of a method of fabricating a semiconductor device according to one or more embodiments of the invention;

FIG. 6C depicts a cross-sectional view of the semiconductor structure of FIG. 1 along the line Z during an intermediate operation of a method of fabricating a semiconductor device according to one or more embodiments of the invention;

FIG. 7A depicts a cross-sectional view of the semiconductor structure of FIG. 1 along the line X during an intermediate operation of a method of fabricating a semiconductor device according to one or more embodiments of the invention;

FIG. 7B depicts a cross-sectional view of the semiconductor structure of FIG. 1 along the line Y during an intermediate operation of a method of fabricating a semiconductor device according to one or more embodiments of the invention;

FIG. 7C depicts a cross-sectional view of the semiconductor structure of FIG. 1 along the line Z during an intermediate operation of a method of fabricating a semiconductor device according to one or more embodiments of the invention;

FIG. 8A depicts a cross-sectional view of the semiconductor structure of FIG. 1 along the line X during an intermediate operation of a method of fabricating a semiconductor device according to one or more embodiments of the invention;

FIG. 8B depicts a cross-sectional view of the semiconductor structure of FIG. 1 along the line Y during an intermediate operation of a method of fabricating a semiconductor device according to one or more embodiments of the invention;

FIG. 8C depicts a cross-sectional view of the semiconductor structure of FIG. 1 along the line Z during an intermediate operation of a method of fabricating a semiconductor device according to one or more embodiments of the invention;

FIG. 9A depicts a cross-sectional view of the semiconductor structure of FIG. 1 along the line X during an intermediate operation of a method of fabricating a semiconductor device according to one or more embodiments of the invention;

FIG. 9B depicts a cross-sectional view of the semiconductor structure of FIG. 1 along the line Y during an intermediate operation of a method of fabricating a semiconductor device according to one or more embodiments of the invention;

FIG. 9C depicts a cross-sectional view of the semiconductor structure of FIG. 1 along the line Z during an intermediate operation of a method of fabricating a semiconductor device according to one or more embodiments of the invention;

FIG. 10A depicts a cross-sectional view of the semiconductor structure of FIG. 1 along the line X during an intermediate operation of a method of fabricating a semiconductor device according to one or more embodiments of the invention;

FIG. 10B depicts a cross-sectional view of the semiconductor structure of FIG. 1 along the line Y during an intermediate operation of a method of fabricating a semiconductor device according to one or more embodiments of the invention;

FIG. 10C depicts a cross-sectional view of the semiconductor structure of FIG. 1 along the line Z during an intermediate operation of a method of fabricating a semiconductor device according to one or more embodiments of the invention;

FIG. 11A depicts a cross-sectional view of the semiconductor structure of FIG. 1 along the line X during an intermediate operation of a method of fabricating a semiconductor device according to one or more embodiments of the invention;

FIG. 11B depicts a cross-sectional view of the semiconductor structure of FIG. 1 along the line Y during an intermediate operation of a method of fabricating a semiconductor device according to one or more embodiments of the invention;

FIG. 11C depicts a cross-sectional view of the semiconductor structure of FIG. 1 along the line Z during an intermediate operation of a method of fabricating a semiconductor device according to one or more embodiments of the invention;

FIG. 12A depicts a cross-sectional view of the semiconductor structure of FIG. 1 along the line X during an intermediate operation of a method of fabricating a semiconductor device according to one or more embodiments of the invention;

FIG. 12B depicts a cross-sectional view of the semiconductor structure of FIG. 1 along the line Y during an intermediate operation of a method of fabricating a semiconductor device according to one or more embodiments of the invention;

FIG. 12C depicts a cross-sectional view of the semiconductor structure of FIG. 1 along the line Z during an intermediate operation of a method of fabricating a semiconductor device according to one or more embodiments of the invention;

FIG. 13A depicts a cross-sectional view of the semiconductor structure of FIG. 1 along the line X during an intermediate operation of a method of fabricating a semiconductor device according to one or more embodiments of the invention;

FIG. 13B depicts a cross-sectional view of the semiconductor structure of FIG. 1 along the line Y during an intermediate operation of a method of fabricating a semiconductor device according to one or more embodiments of the invention;

FIG. 13C depicts a cross-sectional view of the semiconductor structure of FIG. 1 along the line Z during an intermediate operation of a method of fabricating a semiconductor device according to one or more embodiments of the invention;

Figure 1:
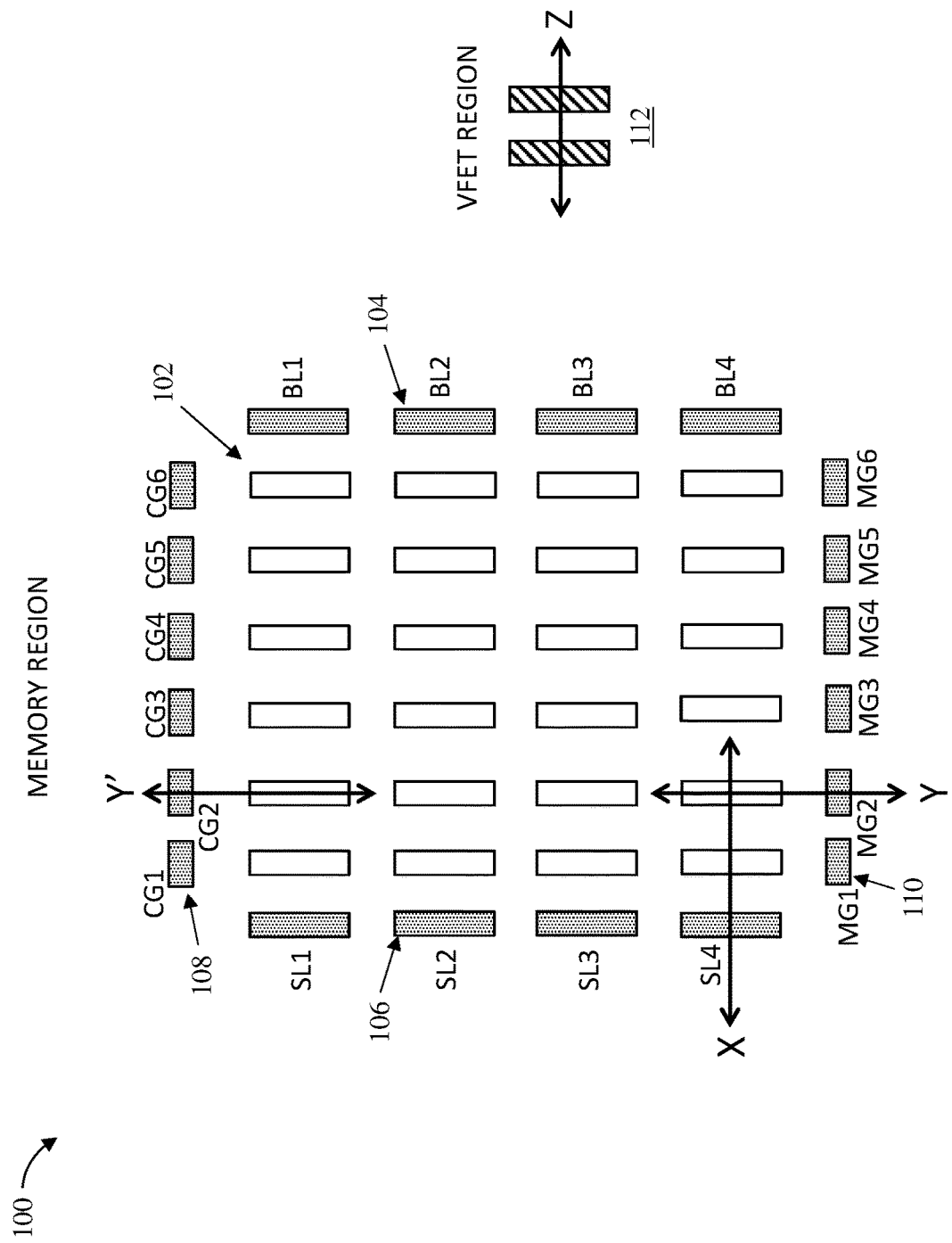
FIG. 1 depicts a top-down view of a semiconductor structure according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, a metal-oxide-semiconductor field-effect transistor (MOSFET) is used for amplifying or switching electronic signals. The MOSFET has a source, a drain, and a metal oxide gate electrode. The metal gate portion of the metal oxide gate electrode is electrically insulated from the main semiconductor n-channel or p-channel by the oxide portion of the metal oxide gate electrode. The oxide portion of the gate electrode can be implemented as a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (NFET) and p-type field effect transistors (PFET) are two types of complementary MOSFETs. The NFET includes n-doped source and drain junctions and uses electrons as the current carriers. The PFET includes p-doped source and drain junctions and uses holes as the current carriers.

To increase transistor densities, some device manufacturers have developed non-planar transistor architectures including, for example, a vertical FET (VFET). In VFETs, the source to drain current flows through a fin-shaped channel in a direction that is perpendicular to a major surface of the substrate. For example, in a known VFET configuration a major substrate surface is horizontal, and a vertical fin or nanowire extends upward from the substrate surface. A source region and a drain region are situated in electrical contact with the top and bottom ends of the fin-shaped channel region, while the gate is disposed on one or more of the fin or nanowire sidewalls.

As discussed previously herein, embedding a nonvolatile memory cell and a logic semiconductor device together on the same silicon substrate can enable improved, high-performance electronic devices. Consequently, the integration of state-of-art logic technologies such as VFETs with embedded memory is desirable.

Some embedded memory architectures, such as floating gate flash, are difficult to integrate with VFET-based logic due to the different gate heights required by the VFET and floating gate structures. SG-MONOS memory theoretically solves this problem, as both SG-MONOS and VFET structures have the same gate height, but no solution is currently available for integrating SG-MONOS with late-node (e.g., 14 nm and beyond) VFETs with replacement metal gate (RMG) process flows. Moreover, even if SG-MONOS can be integrated with VFETs, the increased footprint (increase side by side memory width) raises real concerns with respect to area scaling.

Turning now to an overview of aspects of the present invention, one or more embodiments of the invention address the above-described shortcomings of the prior art by providing fabrication methods and resulting structures for integrating a vertical SG-MONOS memory with a VFET. The integration scheme described herein enables the co-existence of a SG-MONOS memory with a VFET without increasing the device footprint as would be expected when integrating conventional SG-MONOS memory. This is accomplished by building the SG-MONOS vertically (i.e., a vertical SG-MONOS). Advantageously, the vertical SG-MONOS can be built in parallel with the VFET fabrication workflow.

To build the vertical SG-MONOS and VFET in parallel, SG-MONOS fins and VFET fins are formed at substantially the same time in the substrate. The VFET fins are then blocked, and the height of the SG-MONOS fins is increased by recessing portions of the substrate. A buried contact is formed at the base of the SG-MONOS fins. A memory stack and memory gate is formed over the buried contact, around a bottom portion of the SG-MONOS fins. The memory stack and memory gate can be recessed such that both are below a top surface of a bottom source/drain region of the VFET. A control gate stack can be formed over a top portion of the SG-MONOS fins and a logic gate stack can be formed over the VFET. The control gate stack and the logic gate stack can have a same height.

Turning now to a more detailed description of aspects of the present invention, FIG. 1 depicts a top-down view of a partially fabricated semiconductor structure 100 after an initial set of fabrication operations have been performed in accordance with embodiments of the invention. In some embodiments of the invention, the semiconductor structure 100 includes a vertical SG-MONOS memory region. As depicted in FIG. 1, the semiconductor structure 100 includes an array of SG-MONOS memory devices 102. Each of the memory devices 102 can be individually addressed using the bit lines 104 (BL1, BL2, etc.), the source lines 106 (SL1, SL2, etc.), the control gates 108 (CG1, CG2, etc.), and the memory gates 110 (MG1, MG2, etc.). As further depicted in FIG. 1, the semiconductor structure 100 includes an integrated VFET region having one or more VFETs 112.

FIGS. 2A, 2B, and 2C depict cross-sectional views of the partially fabricated semiconductor structure 100 along the lines X (across fin), Y (across gate), and Z of FIG. 1 after an initial set of fabrication operations have been performed in accordance with embodiments of the invention. As depicted in FIG. 2A, the partially fabricated semiconductor structure 100 can include one or more semiconductor fins 202 formed on a substrate 204.

The semiconductor fins 202 can be formed on the substrate 204 using known front-end-of-line (FEOL) VFET fabrication techniques. For example, in some embodiments of the invention, a hard mask 206 is patterned to expose portions of the substrate 204. The exposed portions of the substrate 204 can then be recessed to form a plurality of semiconductor fins. The exposed portions of the substrate 204 can be removed using an etch process, which can be a wet etch process, a dry etch process or a combination thereof. In some embodiments of the invention, the hard mask 206 includes a nitride, such as silicon nitride. In some embodiments of the invention, the hard mask 206 is formed to a thickness of 40 nm, although other thicknesses are within the contemplated scope of the invention.

The semiconductor fins 202 can each have a height ranging from 4 nm to 150 nm. In some embodiments of the present invention, the semiconductor fins 202 are formed to a height of about 20 nm. Each of the fins can have a width ranging from 5 nm to 50 nm. The fins can be separated by a pitch ranging from 10 nm to 100 nm. The semiconductor fins 202 can be doped with n-type dopants (e.g., As, P, Sb) or p-type dopants (e.g., B, $BF_2$, Al, Ga) to form nFET semiconductor fins and pFET semiconductor fins, as desired. The dopant concentration can range from $1 \times 10^{19}$ $cm^{-3}$ to $2 \times 10^{21}$ $cm^{-3}$, or between $1 \times 10^{20}$ $cm^{-3}$ and $1 \times 10^{21}$ $cm^{-3}$. In some embodiments of the invention, the semiconductor fins 202 are epitaxially grown on the substrate 204.

The semiconductor fins 202 can be made of any suitable material, such as, for example, Si, SiGe, Group II-IV compound semiconductor, Group III-V compound semiconductor, or other suitable materials. Group III-V compound semiconductors include materials having at least one group III element and at least one group V element, such as, for example, one or more of aluminum gallium arsenide (Al-GaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

The substrate 204 can be made of any suitable substrate material, such as, for example, Si, SiGe, SiC, Group III-V compound semiconductor, Group II-VI compound semiconductor, or semiconductor-on-insulator (SOI). For example, in embodiments where the semiconductor fins 202 are made of InGaAs, the substrate 204 can be made of InP. In some embodiments of the invention, the substrate 204 includes a buried oxide layer (not depicted). The buried oxide layer can be made of any suitable dielectric material, such as, for example, a silicon oxide. In some embodiments of the invention, the buried oxide layer is formed to a thickness of about 145 nm, although other thicknesses are within the contemplated scope of the invention. In some embodiments of the invention, the semiconductor structure 100 can be electrically isolated from other regions of the substrate 204 by a shallow trench isolation region (not depicted).

FIGS. 3A, 3B, and 3C depict cross-sectional views of the partially fabricated semiconductor structure 100 during an intermediate operation of a method of fabricating a semiconductor device according to one or more embodiments of the invention. As depicted in FIG. 3C, a mask 302 can be formed over the VFET region. The mask 302 can be formed using any suitable material, such as, for example, a silicon nitride or organic planarization layer (OPL). Once the VFET region is blocked, the substrate 204 can be recessed in the memory region, as depicted in FIGS. 3A and 3B. In this manner, the semiconductor fins 202 in the memory region can have a greater height than the semiconductor fins 202 in the VFET region.

FIGS. 4A, 4B, and 4C depict cross-sectional views of the partially fabricated semiconductor structure 100 during an intermediate operation of a method of fabricating a semiconductor device according to one or more embodiments of the invention. As depicted in FIG. 4C, the mask 302 can be removed and a bottom source/drain 402 can be formed.

In some embodiments of the invention, the bottom source/drain 402 is formed by doping a top portion of the substrate 204. In some embodiments of the invention, the bottom source/drain 402 is epitaxially grown on the substrate 204. Epitaxial semiconductor materials can be grown using, for example, vapor-phase epitaxy (VPE), molecular beam epitaxy (MBE), liquid-phase epitaxy (LPE), or other suitable processes. The bottom source/drain 402 can include epitaxial semiconductor materials grown from gaseous or liquid precursors.

In some embodiments of the invention, the gas source for the deposition of epitaxial semiconductor material includes a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments of the invention, the epitaxial semiconductor materials include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Epitaxial silicon and silicon germanium can be doped by adding n-type dopants (e.g., phosphorus or arsenic) or p-type dopants (e.g., Ga, B, $BF_2$, or Al). In some embodiments of the invention, the bottom source/drain 402 can be epitaxially formed and doped by a variety of methods, such as, for example, in-situ doped epitaxy (doped during deposition), doped following the epitaxy, or by implantation and plasma doping. The dopant concentration in the doped regions can range from $1 \times 10^{19}$ $cm^{-3}$ to $2 \times 10^{21}$ $cm^{-3}$, or between $1 \times 10^{20}$ $cm^{-3}$ and $1 \times 10^{21}$ $cm^{-3}$.

FIGS. 5A, 5B, and 5C depict cross-sectional views of the partially fabricated semiconductor structure 100 during an intermediate operation of a method of fabricating a semiconductor device according to one or more embodiments of the invention. As depicted in FIG. 5A, spacers 502 can be formed on sidewalls of the semiconductor fins 202. The spacers 502 can be made of any suitable material, such as, for example, a low-k dielectric, a nitride, silicon nitride, silicon oxide, SiON, SiC, SiOCN, or SiBCN. In some embodiments of the invention, the spacers 502 are silicon oxide spacers. The spacers 502 can be formed to a thickness of about 2 to 10 nm, although other thicknesses are within the contemplated scope of the invention.

The spacers 502 can be formed using a chemical vapor deposition (CVD), plasma-enhanced CVD (PECVD), ultra-high vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), physical vapor deposition (PVD), chemical solution deposition, or other like process. For example, spacer material can be bulk or conformally deposited over the semiconductor structure 100 and then patterned to form the spacers 502. In some embodiments of the invention, spacer material is bulk deposited over the semiconductor structure 100, patterned (using, e.g., a RIE), and then planarized to a surface of the hard mask 206 (using, e.g., CMP).

As depicted in FIG. 5A, exposed portions of the bottom source/drain 402 can be removed and the substrate 204 can be recessed. In some embodiments of the invention, the bottom source/drain 402 and the substrate 204 can be removed selective to the spacers 502, using, for example, a wet etch, a dry etch, or a combination of sequential wet and/or dry etches.

FIGS. 6A, 6B, and 6C depict cross-sectional views of the partially fabricated semiconductor structure 100 during an intermediate operation of a method of fabricating a semiconductor device according to one or more embodiments of the invention. As depicted in FIG. 6A, a buried contact 602 can be formed over the recessed surface of the substrate 204. The contact 602 can be formed or deposited using known metallization techniques. In some embodiments of the invention, the contact 602 is overfilled and then recessed.

The contact 602 can be made of any suitable conducting material, such as, for example, metal (e.g., tungsten, titanium, tantalum, ruthenium, zirconium, cobalt, copper, aluminum, platinum), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the contact 602 is a tungsten contact. The conductive material can further include dopants that are incorporated during or after deposition. In some embodiments of the invention, the contact 602 can be made of copper and can include a barrier metal liner. The barrier metal liner prevents the copper from diffusing into, or doping, the surrounding materials, which can degrade their properties. Examples include tantalum nitride and tantalum (TaN/Ta), titanium, titanium nitride, cobalt, ruthenium, and manganese.

FIGS. 7A, 7B, and 7C depict cross-sectional views of the partially fabricated semiconductor structure 100 during an intermediate operation of a method of fabricating a semiconductor device according to one or more embodiments of the invention. As depicted in FIG. 7A, additional spacer material can be deposited over the semiconductor structure 100. The spacer material can be deposited to a thickness of 100 nm, although other thicknesses are within the contemplated scope of the invention.

FIGS. 8A, 8B, and 8C depict cross-sectional views of the partially fabricated semiconductor structure 100 during an intermediate operation of a method of fabricating a semiconductor device according to one or more embodiments of the invention. As depicted in FIG. 8A, a mask 802 can be formed over the semiconductor structure 100. The mask 802 can be formed using any suitable material, such as, for example, a silicon nitride or organic planarization layer (OPL). As depicted in FIG. 8B, the mask 802 can be patterned and portions of the spacers 502, the contact 602, and the substrate 204 can be removed selective to the mask 802. In some embodiments of the invention, the substrate 204 is recessed below a bottom surface of the contact 602.

FIGS. 9A, 9B, and 9C depict cross-sectional views of the partially fabricated semiconductor structure 100 during an intermediate operation of a method of fabricating a semiconductor device according to one or more embodiments of the invention. As depicted in FIGS. 9A and 9B, the mask 802 and the spacers 502 can be removed from the memory region of the semiconductor device 102. The mask 802 and the spacers 502 can be removed, using, for example, a wet etch, a dry etch, or a combination of sequential wet and/or dry etches.

FIGS. 10A, 10B, and 10C depict cross-sectional views of the partially fabricated semiconductor structure 100 during an intermediate operation of a method of fabricating a semiconductor device according to one or more embodiments of the invention. As depicted in FIG. 10C, the mask 802 can be removed using, for example, a wet etch, a dry etch, or a combination of sequential wet and/or dry etches.

As depicted in FIG. 10B, a shallow trench isolation (STI) region 1002 (sometimes referred to as a lower STI region) can be formed on the recessed surface of the substrate 204. The STI region 1002 can be formed using any suitable isolation material, such as, for example, silicon nitride, silicon oxide, or SiBCN.

FIGS. 11A, 11B, and 11C depict cross-sectional views of the partially fabricated semiconductor structure 100 during an intermediate operation of a method of fabricating a semiconductor device according to one or more embodiments of the invention. As depicted in FIG. 11B, a tunneling oxide layer 1102, charge storage layer 1104, and insulating oxide layer 1106 (collectively, charge storage stack 1102/1104/1106) can be formed over the contact 602 and on sidewalls of the semiconductor fins 202 in the memory region.

The charge storage layer 1104 is positioned between the tunneling oxide layer 1102 and the insulating oxide layer 1106. The charge storage layer 1104 can be formed using any suitable material, such as, for example, a silicon nitride film. In some embodiments of the invention, the charge storage layer 1104 is formed to a thickness of about 5 to 20 nm, although other thicknesses are within the contemplated scope of the invention. As configured, the silicon nitride film has a discrete trap state, and a capability to accumulate an electric charge in the trap state. The insulating films (i.e., the tunneling oxide layer 1102 and the insulating oxide layer 1106) can include a silicon oxide film or other suitable insulating material. The thickness of the tunneling oxide layer 1102 can be about 1 to 10 nm and the thickness of the insulating oxide layer 1106 can be about 5 to 15 nm. In some embodiments of the invention, the tunneling oxide layer 1102 and the insulating oxide layer 1106 can be made of silicon oxide films and nitrogen.

As further depicted in FIG. 11B, a memory gate layer 1108 is formed over the tunneling oxide layer 1102, charge storage layer 1104, and insulating oxide layer 1106. In some embodiments of the invention, the memory gate layer 1108 is a conductive film, formed to a thickness of about 10 to 100 nm, although other thicknesses are within the contemplated scope of the invention. The memory gate layer 1108 can be formed using any suitable conductive film material, such as, for example, a doped polycrystalline silicon film. In some embodiments of the invention, the memory gate layer 1108 can include dopants having a concentration of about $2 \times 10^{20}$ cm$^{-3}$.

In some embodiments of the invention, a dielectric layer 1110 is formed over the memory gate layer 1108. In some embodiments of the invention, the dielectric layer 1110 includes an organic planarization layer. In some embodiments of the invention, the dielectric layer 1110 is deposited over the semiconductor structure 100 and recessed to expose sidewalls of the charge storage stack 1102/1104/1106. As depicted in FIG. 11A, the charge storage stack 1102/1104/1106 can be chamfered below a surface of the semiconductor fins 202. In some embodiments of the invention, the charge storage stack 1102/1104/1106 and the memory gate layer 1108 are recessed/chamfered below a top surface of the bottom source/drain 402 in the VFET region.

FIGS. 12A, 12B, and 12C depict cross-sectional views of the partially fabricated semiconductor structure 100 during an intermediate operation of a method of fabricating a semiconductor device according to one or more embodiments of the invention. As depicted in FIGS. 12A and 12B, spacers 1202 can be formed on the charge storage stack 1102/1104/1106 and on sidewalls of the semiconductor fins 202.

The spacers 1202 can be made of any suitable material, such as, for example, a low-k dielectric, a nitride, silicon nitride, silicon oxide, SiON, SiC, SiOCN, or SiBCN. In some embodiments of the invention, the spacers 1202 are silicon nitride spacers. The spacers 1202 can be formed to a thickness of about 2 to 10 nm, although other thicknesses are within the contemplated scope of the invention.

The spacers 1202 can be formed using CVD, PECVD, UHVCVD, RTCVD, MOCVD, LPCVD, LRPCVD, ALD, PVD, chemical solution deposition, or other like process. For example, spacer material can be bulk or conformally deposited over the semiconductor structure 100 and then patterned to form the spacers 1202. In some embodiments of the invention, spacer material is bulk deposited over the semiconductor structure 100, patterned (using, e.g., a RIE), and then planarized to a surface of the hard mask 206 (using, e.g., CMP).

As depicted in FIG. 12B, additional dielectric material can be deposited over portions of the semiconductor structure. In this manner, the thickness of the dielectric layer 1110 can be increased to cover the semiconductor fin 202 and the hard mask 206. As depicted in FIG. 12A, portions of the dielectric layer 1110, portions of the memory gate layer 1108, and portions of the charge storage stack 1102/1104/1106 can be removed to expose a surface of the contact 602.

FIGS. 13A, 13B, and 13C depict cross-sectional views of the partially fabricated semiconductor structure 100 during an intermediate operation of a method of fabricating a semiconductor device according to one or more embodiments of the invention. As depicted in FIGS. 13A and 13B, the dielectric layer 1110 and the spacers 1202 can be removed to expose a surface of the charge storage stack 1102/1104/1106 and a surface of the contact 602 in the memory region. As depicted in FIG. 13C, the spacers 502 can be removed to expose a surface of the substrate 204 in the VFET region.

In some embodiments of the invention, an STI region 1302 (sometimes referred to as an upper STI region) can be formed on the charge storage stack 1102/1104/1106 and a surface of the contact 602 in the memory region. In some embodiments of the invention, the STI region 1302 can be formed on the substrate 204. The STI region 1302 can be formed using any suitable isolation material, such as, for example, silicon nitride, silicon oxide, or SiBCN.

Figures 14A, 14B:
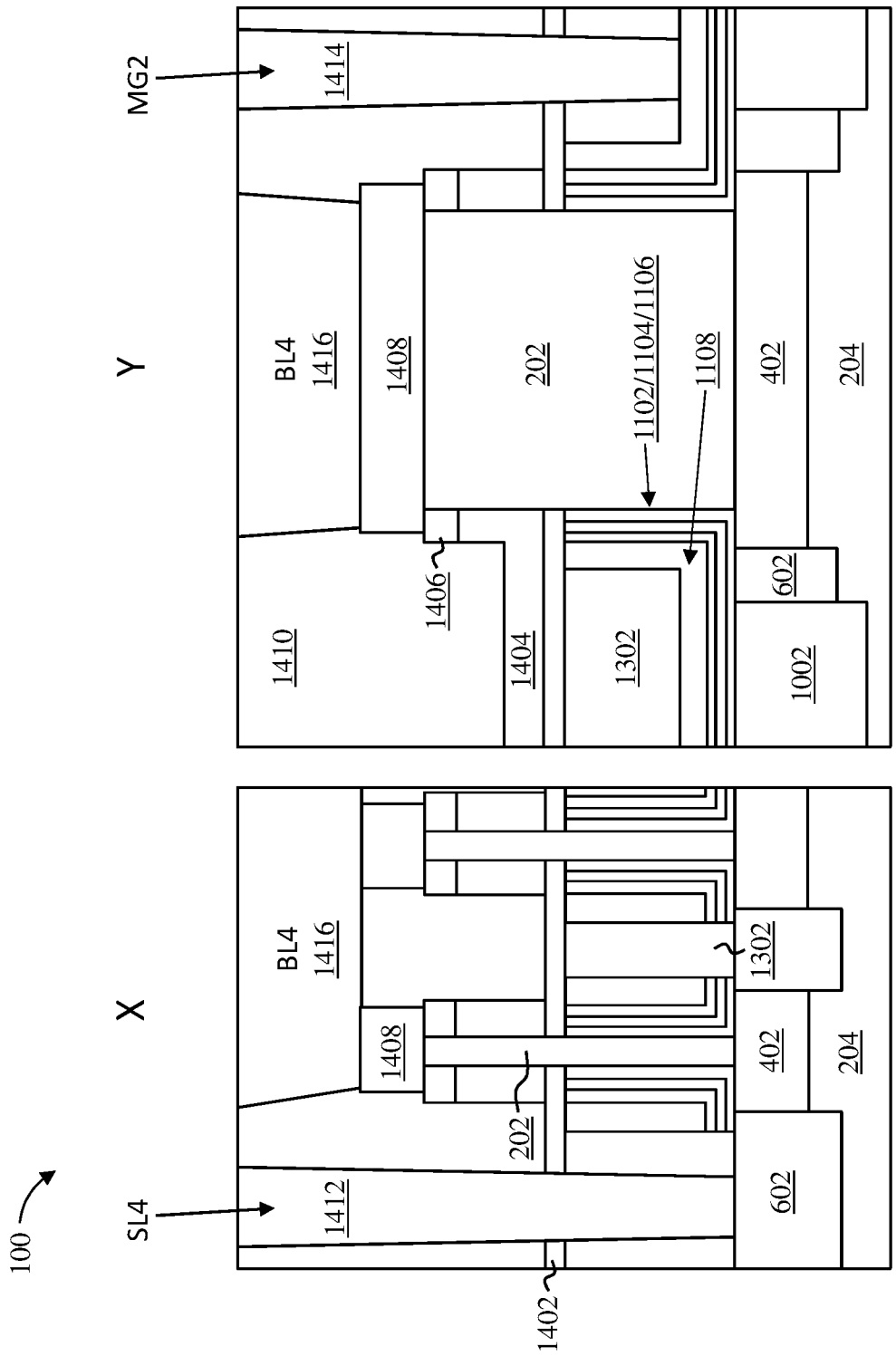
FIG. 14A depicts a cross-sectional view of the semiconductor structure of FIG. 1 along the line X during an intermediate operation of a method of fabricating a semiconductor device according to one or more embodiments of the invention.
FIG. 14B depicts a cross-sectional view of the semiconductor structure of FIG. 1 along the line Y during an intermediate operation of a method of fabricating a semiconductor device according to one or more embodiments of the invention.

FIGS. 14A and 14B depict cross-sectional views of the partially fabricated semiconductor structure 100 along the lines X and Y of FIG. 1, respectively, during an intermediate operation of a method of fabricating a semiconductor device according to one or more embodiments of the invention. Advantageously, the semiconductor structure 100 can be completed using a VFET process flow.

As depicted in FIG. 14A, the semiconductor structure 100 can include a bottom spacer 1402, a gate 1404 (sometimes referred to as a high-k metal gate, or HKMG), a top spacer 1406, a top source/drain 1408, and an interlayer dielectric 1410. The bottom spacer 1402 and top spacer 1406 can be formed using any suitable spacer material, such as, for example, a low-k dielectric, a nitride, silicon nitride, silicon oxide, SiON, SiC, SiOCN, or SiBCN. In some embodiments of the invention, the bottom spacer 1402 and top spacer 1406 are formed using CVD, PECVD, ALD, PVD, chemical solution deposition, or other like processes. The bottom spacer 1402 and top spacer 1406 can be formed to a thickness of about 5 to 10 nm, although other thicknesses are within the contemplated scope of the invention. The bottom spacer 1402 and top spacer 1406 can be formed of a same or different spacer material and can be formed to a same or different thickness.

In some embodiments of the invention, the gate 1404 can be a high-k metal gate (HKMG) formed using, for example, known replacement metal gate (RMG) processes. The gate 1404 can include a high-k dielectric material(s), a work function metal stack, and a bulk gate material(s). In some embodiments of the invention, the gate 1404 in the memory region is referred to as a control gate, and the gate 1404 in the VFET region is referred to as a logic gate.

In some embodiments of the invention, the high-k dielectric film (not depicted) is formed on a surface (sidewall) of the semiconductor fins 202. The high-k dielectric film can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the high-k dielectric film can have a thickness of about 0.5 nm to about 4 nm. In some embodiments of the invention, the high-k dielectric film includes hafnium oxide and has a thickness of about 1 nm, although other thicknesses are within the contemplated scope of the invention.

In some embodiments of the invention, one or more work function layers (not depicted, sometimes referred to as a work function metal stack) are formed between the high-k dielectric film and the bulk gate material. The work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layer can serve to modify the work function of the gate 1404 and enables tuning of the device threshold voltage. The work function layers can be formed to a thickness of about 0.5 to 6 nm, although other thicknesses are within the contemplated scope of the invention. In some embodiments of the invention, each of the work function layers can be formed to a different thickness. In some embodiments of the invention, the work function layers include a TiN/TiC/TiCAl stack.

In some embodiments of the invention, a bulk gate material is deposited over the work function layers. The bulk gate material can include any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive material can further include dopants that are incorporated during or after deposition.

In some embodiments of the invention, the interlayer dielectric 1410 is formed over the semiconductor structure 100. The interlayer dielectric 1410 can be made of any suitable dielectric material, such as, for example, porous silicates, carbon doped oxides, silicon dioxides, silicon nitrides, silicon oxynitrides, or other dielectric materials. Any known manner of forming the interlayer dielectric 1410 can be utilized, such as, for example, CVD, PECVD, ALD, flowable CVD, spin-on dielectrics, or PVD.

In some embodiments of the invention, the top source/drain 1408 is epitaxially grown on a surface of the semiconductor fins 202. Epitaxial semiconductor materials can be grown using, for example, VPE, MBE, LPE, or other suitable processes. The top source/drain 1408 can include epitaxial semiconductor materials grown from gaseous or liquid precursors and can be doped in a similar manner as the bottom source/drain 402 (although the dopant concentrations need not be the same).

As depicted in FIG. 14A, a first contact 1412 (labeled "SL4" in reference to FIG. 1) can be formed on a surface of the contact 602. The first contact 1412 can be formed or deposited using known metallization techniques. In some embodiments of the invention, the interlayer dielectric 1410 is patterned with open trenches, portions of the bottom spacer 1402 are removed, and a bulk contact material is deposited into the trenches. In some embodiments of the invention, the first contact 1412 is overfilled into the trenches, forming overburdens above a surface of the interlayer dielectric 1410. In some embodiments of the invention, a CMP removes the overburden.

The first contact 1412 can be made of any suitable conducting material, such as, for example, metal (e.g., tungsten, titanium, tantalum, ruthenium, zirconium, cobalt, copper, aluminum, platinum), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the first contact 1412 is a tungsten contact. The conductive material can further include dopants that are incorporated during or after deposition. In some embodiments of the invention, the first contact 1412 can be made of copper and can include a barrier metal liner. The barrier metal liner prevents the copper from diffusing into, or doping, the surrounding materials, which can degrade their properties. Examples include tantalum nitride and tantalum (TaN/Ta), titanium, titanium nitride, cobalt, ruthenium, and manganese.

As depicted in FIG. 14B, a second contact 1414 (labeled "MG2" in reference to FIG. 1) can be formed on a surface of the memory gate layer 1108. The second contact 1414 can be made of a similar material, and in a similar manner, as the first contact 1412. In some embodiments of the invention, the interlayer dielectric 1410 is patterned with open trenches, portions of the bottom spacer 1402 are removed, and a bulk contact material is deposited into the trenches.

As depicted in FIGS. 14A and 14B, a third contact 1416 (labeled "BL4" in reference to FIG. 1) can be formed on a surface of the top source/drain 1408 in the memory region. The third contact 1416 can be made of a similar material, and in a similar manner, as the first contact 1412. In some embodiments of the invention, the interlayer dielectric 1410 is patterned with open trenches and a bulk contact material is deposited into the trenches.

Figures 15A, 15B:
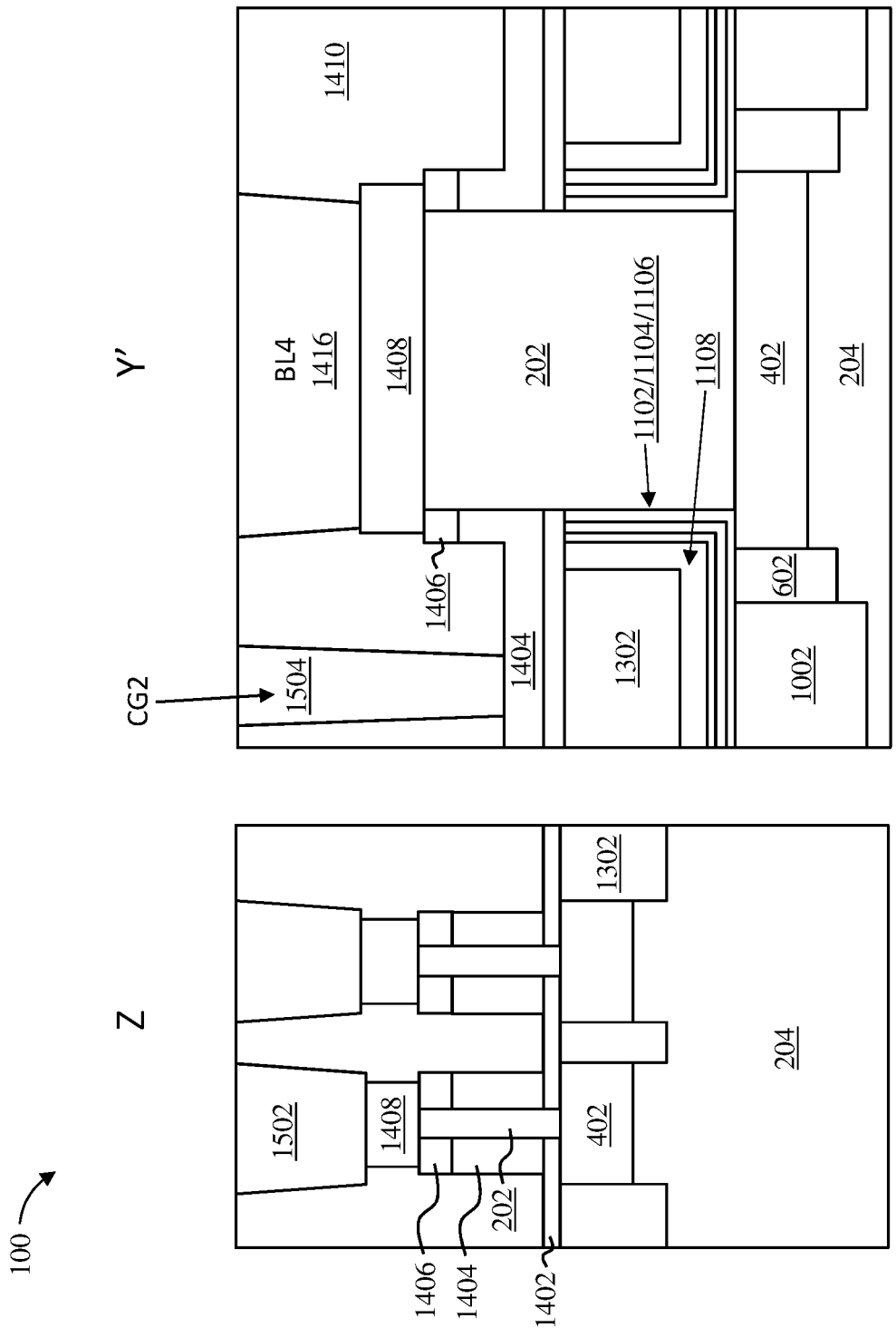
FIG. 15A depicts a cross-sectional view of the semiconductor structure of FIG. 1 along the line Z during an intermediate operation of a method of fabricating a semiconductor device according to one or more embodiments of the invention.
FIG. 15B depicts a cross-sectional view of the semiconductor structure of FIG. 1 along the line Y' during an intermediate operation of a method of fabricating a semiconductor device according to one or more embodiments of the invention.

FIGS. 15A and 15B depict cross-sectional views of the partially fabricated semiconductor structure 100 along the lines Z and Y' of FIG. 1, respectively, during an intermediate operation of a method of fabricating a semiconductor device according to one or more embodiments of the invention. As depicted in FIG. 15A, a fourth contact 1502 can be formed on a surface of the top source/drain 1408 in the VFET region. The fourth contact 1502 can be made of a similar material, and in a similar manner, as the first contact 1412. In some embodiments of the invention, the interlayer dielectric 1410 is patterned with open trenches and a bulk contact material is deposited into the trenches.

As depicted in FIG. 15B, a fifth contact 1504 (labeled "CG2" in reference to FIG. 1) can be formed on a surface of the gate 1404 in the memory region. The fifth contact 1504 can be made of a similar material, and in a similar manner, as the first contact 1412. In some embodiments of the invention, the interlayer dielectric 1410 is patterned with open trenches and a bulk contact material is deposited into the trenches.

Figure 16:
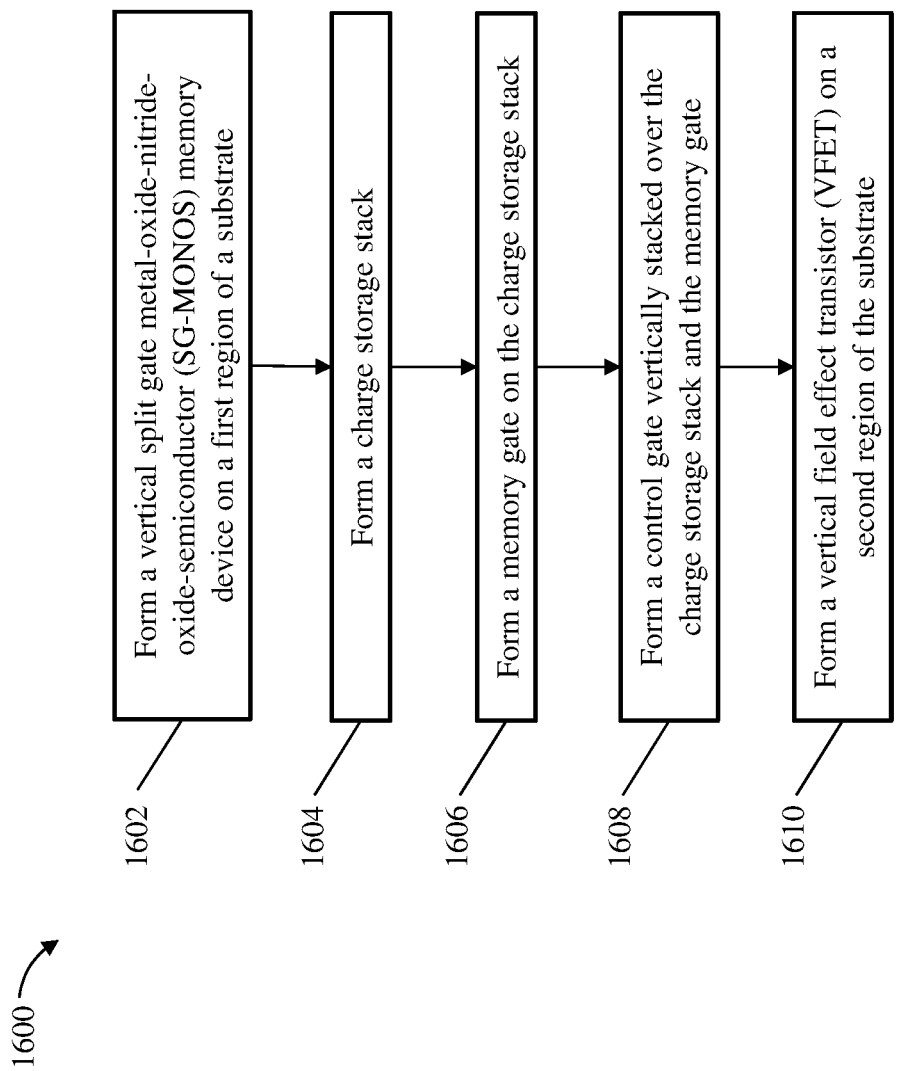
FIG. 16 depicts a flow diagram illustrating a method according to one or more embodiments of the invention.

FIG. 16 depicts a flow diagram 1600 illustrating a method for forming a semiconductor device according to one or more embodiments of the invention. As shown at block 1602, a vertical SG-MONOS memory device is formed on a first region (e.g., memory region) of a substrate. Forming the SG-MONOS memory device can include, forming a charge storage stack at block 1604, forming a memory gate on the charge storage stack at block 1606, and forming a control gate vertically stacked over the charge storage stack and the memory gate at block 1608.

At block 1610, a VFET is formed on a second region of the substrate (e.g., VFET region). The VFET can include a logic gate. In some embodiments of the invention, a topmost surface of the control gate is coplanar to a topmost surface of the logic gate. In some embodiments of the invention, a topmost surface of the memory gate is recessed below a bottommost surface of the logic gate.

In some embodiments of the invention, forming the charge storage stack includes forming a tunneling oxide layer, forming an insulating oxide layer, and forming a charge storage layer between the tunneling oxide layer and the insulating oxide layer.

In some embodiments of the invention, a bottom spacer is formed between the memory gate and the control gate.

In some embodiments of the invention, forming the vertical SG-MONOS memory device further includes forming a first semiconductor fin. In some embodiments of the invention, forming the VFET further comprises forming a second semiconductor fin. In some embodiments of the invention, a bottom surface of the first semiconductor fin is below a bottom surface of the second semiconductor fin. In some embodiments of the invention, a top surface of the first semiconductor fin is coplanar to a top surface of the second semiconductor fin. In some embodiments of the invention, an array of vertical SG-MONOS memory devices is formed on the substrate. In some embodiments of the invention, the array is arranged in a same manner as depicted with respect to FIG. 1.

Figure 17:
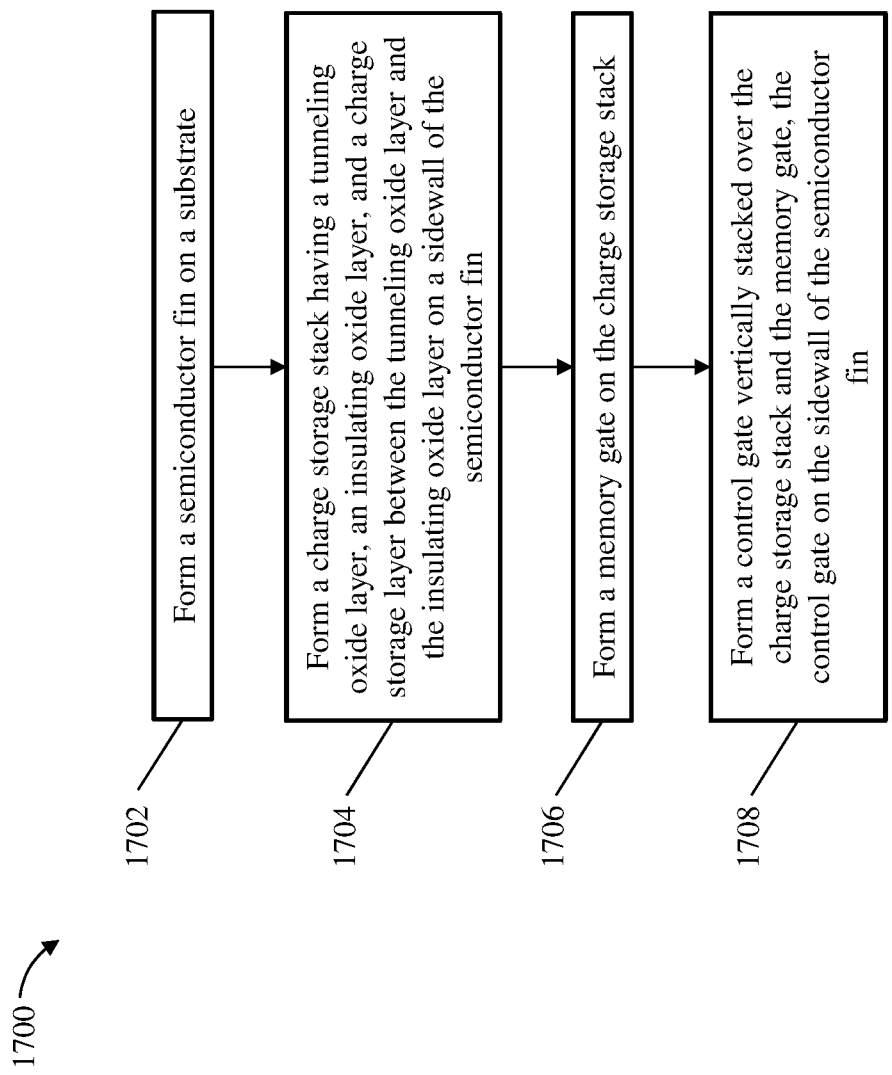
FIG. 17 depicts a flow diagram illustrating a method according to one or more embodiments of the invention.

FIG. 17 depicts a flow diagram 1700 illustrating a method for forming a semiconductor device according to one or more embodiments of the invention. As shown at block 1702, a semiconductor fin is formed on a substrate.

At block 1704, a charge storage stack is formed on a sidewall of the semiconductor fin. The charge storage stack can include a tunneling oxide layer, an insulating oxide layer, and a charge storage layer between the tunneling oxide layer and the insulating oxide layer.

At block 1706, a memory gate is formed on the charge storage stack. At block 1708, a control gate is vertically stacked over the charge storage stack and the memory gate. The control gate can be arranged on the sidewall of the semiconductor fin.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
    forming a vertical split gate metal-oxide-nitride-oxide-semiconductor (SG-MONOS) memory device on a first region of a substrate, wherein forming the SG-MONOS memory device comprises:
        forming a charge storage stack;
        forming a memory gate on the charge storage stack; and
        forming a control gate vertically stacked over the charge storage stack and the memory gate; and
    forming a vertical field effect transistor (VFET) on a second region of the substrate, the VFET comprising a logic gate;
    wherein a first cavity in the first region of the substrate is formed in parallel with a second cavity in the second region of the substrate, the first cavity defining a buried contact region of the SG-MONOS and the second cavity defining a shallow trench isolation region of the VFET.

2. The method of claim 1, wherein a topmost surface of the control gate is coplanar to a topmost surface of the logic gate.

3. The method of claim 1, wherein a topmost surface of the memory gate is recessed below a bottommost surface of the logic gate.

4. The method of claim 1, wherein the charge storage stack comprises:
    a tunneling oxide layer;
    an insulating oxide layer; and
    a charge storage layer between the tunneling oxide layer and the insulating oxide layer.

5. The method of claim 1 further comprising forming a bottom spacer between the memory gate and the control gate.

6. The method of claim 1, wherein forming the vertical SG-MONOS memory device further comprises forming a first semiconductor fin; and wherein forming the VFET further comprises forming a second semiconductor fin.

7. The method of claim 6, wherein a bottom surface of the first semiconductor fin is below a bottom surface of the second semiconductor fin.

8. The method of claim 7, wherein a top surface of the first semiconductor fin is coplanar to a top surface of the second semiconductor fin.

9. The method of claim 1 further comprising forming an array of vertical SG-MONOS memory devices.

10. A method for forming a semiconductor device, the method comprising:
    forming a first semiconductor fin on a substrate;
    forming a second semiconductor fin on the substrate;
    forming a charge storage stack on a sidewall of the first semiconductor fin, the charge storage stack comprising a tunneling oxide layer, an insulating oxide layer, and a charge storage layer between the tunneling oxide layer and the insulating oxide layer;
    forming a memory gate on the charge storage stack;
    forming a control gate vertically stacked over the charge storage stack and the memory gate, the control gate on the sidewall of the first semiconductor fin; and
    forming a logic gate on a sidewall of the second semiconductor fin;
    wherein a first cavity in a first region of the substrate is formed in parallel with a second cavity in a second region of the substrate, the first cavity defining a buried contact region of a split gate metal-oxide-nitride-oxide-semiconductor (SG-MONOS) memory device and the second cavity defining a shallow trench isolation region of a vertical field effect transistor (VFET).

11. The method of claim 10 further comprising recessing a topmost surface of the memory gate below a bottommost surface of the logic gate.

12. The method of claim 11 further comprising forming a bottom spacer between the memory gate and the control gate.

13. The method of claim 12 further comprising forming a bottom source/drain between the second semiconductor fin and the substrate.

14. The method of claim 13, wherein the bottom spacer is between the bottom source/drain and the logic gate.

* * * * *